United States Patent [19]

Yamamitsu et al.

[11] 4,303,952
[45] Dec. 1, 1981

[54] RECORDING AND REPRODUCING SYSTEM

[75] Inventors: Chojuro Yamamitsu, Kawanishi; Ichiro Arimura, Kyoto; Hiroshi Taniguchi, Hirakata, all of Japan

[73] Assignee: Matsushita Electric Industrial Co., Ltd, Osaka, Japan

[21] Appl. No.: 919,298

[22] Filed: Jun. 26, 1978

[30] Foreign Application Priority Data

Jun. 29, 1977 [JP] Japan ............................... 52-78154

[51] Int. Cl.³ .......................... G11B 5/45; G11B 5/02
[52] U.S. Cl. ........................................ 360/65; 360/29
[58] Field of Search ................. 360/65, 68, 29, 30; 358/166, 170

[56] References Cited

U.S. PATENT DOCUMENTS

| | | | |
|---|---|---|---|
| 3,288,930 | 11/1966 | Johnson | 358/166 |
| 3,346,703 | 10/1967 | Mullin et al. | 360/67 |
| 3,659,042 | 4/1972 | Kennedy et al. | 360/30 |
| 3,840,890 | 10/1974 | Sunderland | 360/29 |
| 3,944,853 | 3/1976 | Cooper | 360/67 |
| 4,122,502 | 10/1978 | Kobayashi | 360/65 |

OTHER PUBLICATIONS

Electronic Designers' Handbook by Landee et al., McGraw Hill Book Co., ©1957, Sec. 12-6, 12-7.

Primary Examiner—Vincent P. Canney
Attorney, Agent, or Firm—Stevens, Davis, Miller & Mosher

[57] ABSTRACT

A video signal recording and reproducing system in which a video signal to be recorded is passed through preemphasis means and subsequently angular modulated so that it is recorded on a record medium. During playback operation, the video signal is angular demodulated and deemphasized through a deemphasis means. Preemphasis means comprises both a non-linear preemphasis circuit and a fixed preemphasis circuit. The deemphasis means similarly comprises a fixed deemphasis circuit and a non-linear deemphasis circuit. Each of the non-linear circuits is responsive to the amplitude of an input signal thereon.

9 Claims, 33 Drawing Figures $$f_1 = \frac{1}{2\pi C R_1}$$

AMOUNT OF PREEMPHASIS $$M = 20 \log\left(\frac{R_2}{R_1 + R_2}\right) dB$$

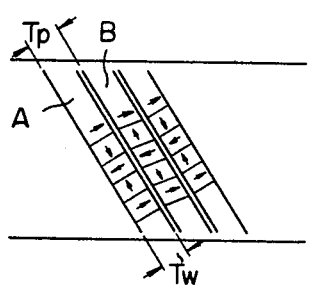
FIG. 11A
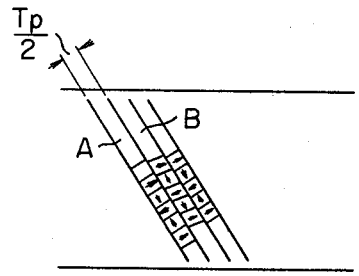
FIG. 11B
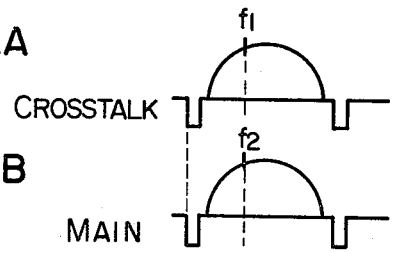
FIG. 12A
FIG. 12B
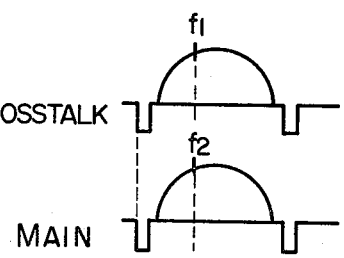
FIG. 12C
FIG. 12D
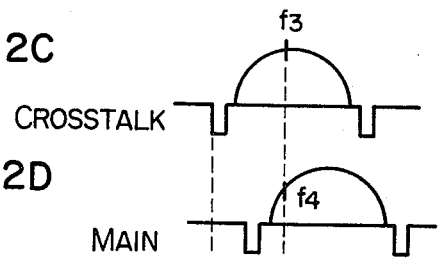
FIG. 13

RECORDING AND REPRODUCING SYSTEM

The present invention relates to a recording and reproducing system such as a magnetic video recording and reproducing system (VTR) or the like in which a signal to be recorded is angular-modulated and recorded on or reproduced from a record medium, for improving an S/N ratio of the reproduced signal.

The recent development of a home VTR is directed toward high density recording in order to reduce the size and reduce the amount of tape used. The high density recording is attained by:

(1) narrowing the width of a record track,
(2) reducing the relative speed by short wavelength recording, or
(3) eliminating a guard band.

The methods (1) and (2) lower the level of reproduced output from a video head. Therefore, an S/N ratio of the reproduced video signal is lowered. The method (3) poses a problem of crosstalk from adjacent tracks.

In the drawings

Figure 4A:
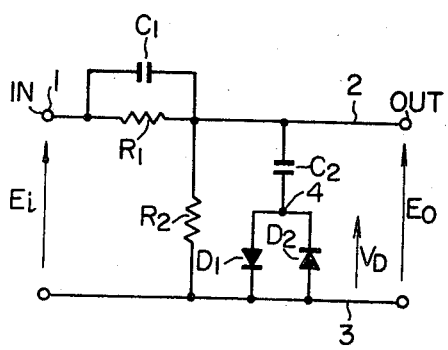
Figure 4B:
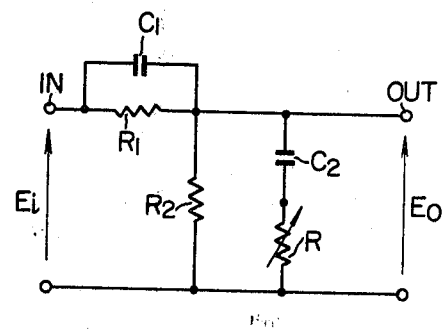
Figure 5:
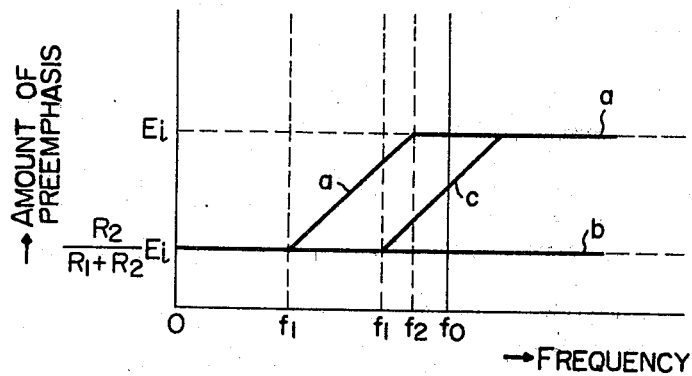
Figure 6A:
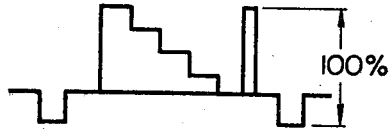
Figure 6A:
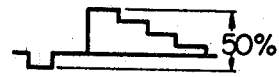
Figure 6B:
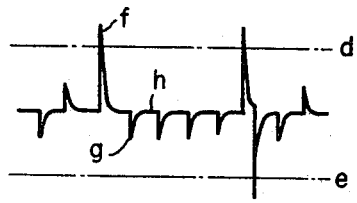
Figure 6B:
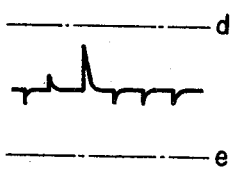
Figure 6C:
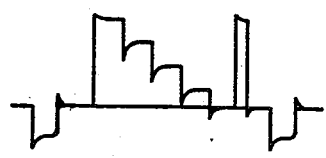
Figure 6C:
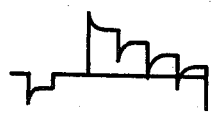
Figure 8:
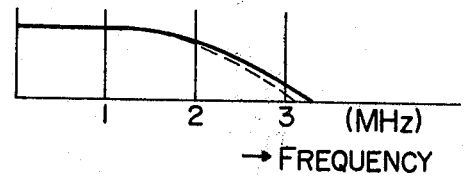
Figure 9:
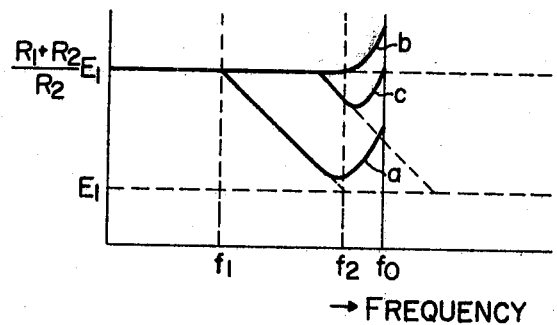
Figure 10A:
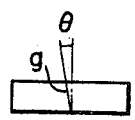
Figure 10B:
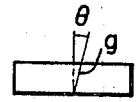
Figure 14:
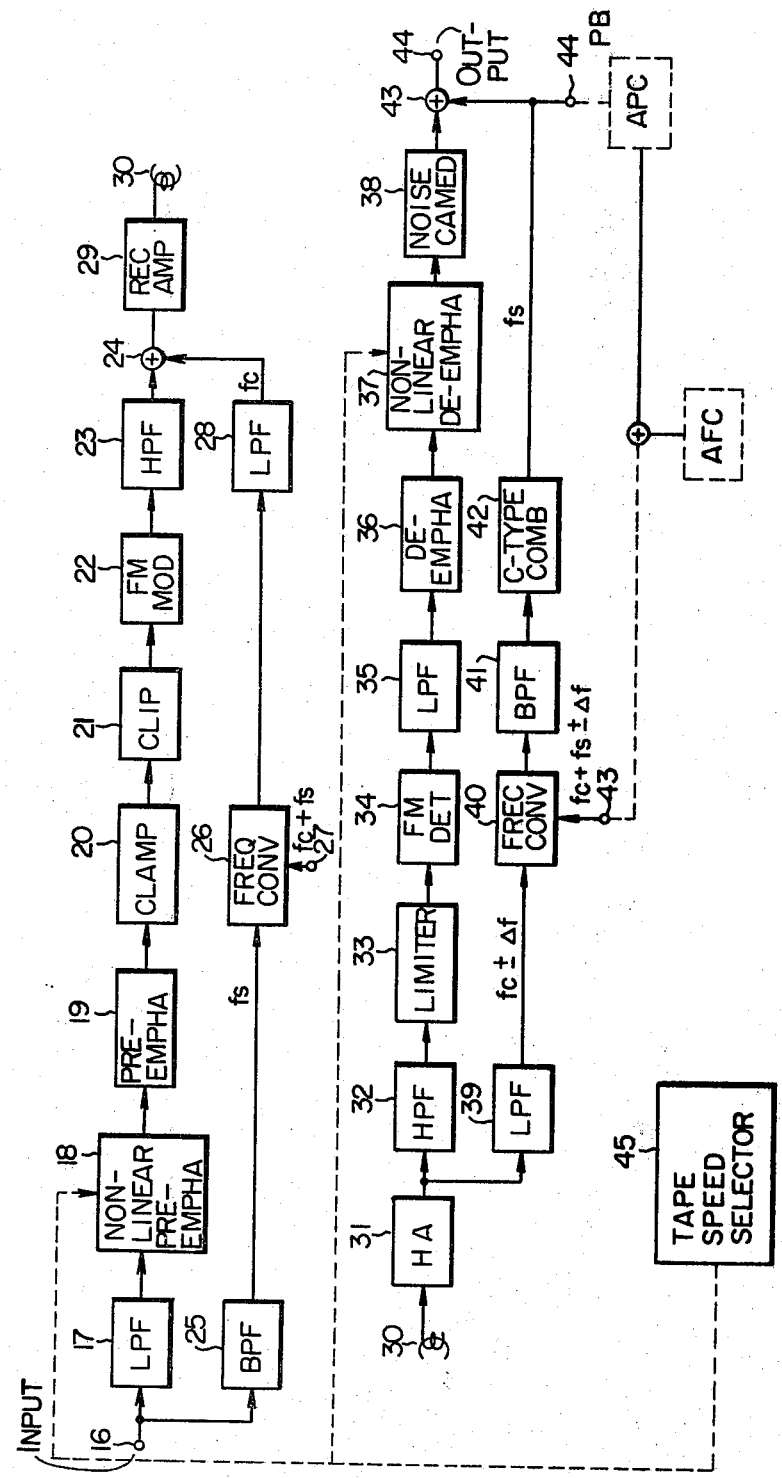

FIGS. 4A and 4B a non-linear preemphasis circuit of the present invention and an equivalent circuit thereof;

FIG. 5 shows the non-linear preemphasis characteristic of the circuit of FIG. 4;

FIGS. 6A to 6C' illustrate operation of nonlinear preemphasis in the circuit of FIG. 4;

FIGS. 7A, 7B, 7C and 7D show non-linear deemphasis circuits corresponding to the non-linear preemphasis circuits of FIG. 4, respectively;

FIG. 8 shows a reproduced signal frequency characteristic of a recording and reproducing system;

FIG. 9 shows a non-linear deemphasis characteristic of FIG. 7;

FIGS. 10A and 10B are front views showing azimuth heads;

FIGS. 11A and 11B show record patterns in a recording and reproducing system suited for use with the present invention;

FIGS. 12A to 12D illustrate crosstalk of luminescence signal in the patterns shown in FIG. 11;

FIG. 13 shows another embodiment of the non-linear emphasis circuit of the present invention; and FIG. 14 is a block diagram showing a basic configuration of a recording and reproducing system embodying the present invention.

Figure 1:
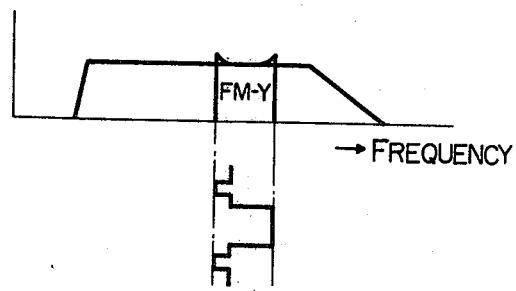
FIG. 1 shows a spectrum chart of angular modulation (frequency modulation)
Figure 2A:
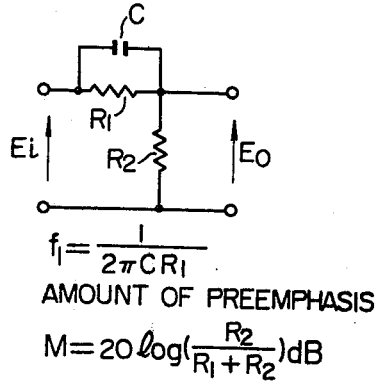
FIGS. 2A and 2B show a typical preemphasis circuit and a characteristic curve thereof.
Figure 2B:
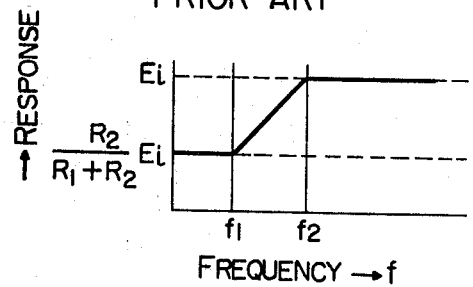

In the recording and playback of a color television signal, a luminescence signal is usually angular-modulated (e.g. by frequency modulation (FM)) at a high frequency band thereof before it is recorded, as shown in FIG. 1. In recording and playback using the angular modulation, a preemphasis circuit which preemphasizes higher frequency components more heavily is usually used before an angular modulation stage in order to reduce triangular noise or modulation noise. The preemphasis circuit may be constructed in any of various ways and a basic equivalent circuit thereof is shown in FIG. 2A, and a preemphasis characteristic thereof is shown in FIG. 2B. An output from the preemphasis circuit is angular-modulated and then recorded and reproduced, and the reproduced angular-modulated signal is again angular-demodulated to reproduce a video signal, which is passed through a deemphasis circuit having an inverse characteristic to that used in recording. In this manner, the triangular noise or modulation noise can be reduced while the frequency characteristic of the signal remains flat. In order to improve the S/N ratio in this system, the amount of preemphasis M (see FIG. 2B) is selected to be large and a corner frequency $f_1$ is selected to be low so that the triangular noise and the modulation noise at a relatively low frequency are reduced and hence the S/N ratio is improved. However, when the amount of preemphasis M is large and the corner frequency $f_1$ is low, a reproduced waveform includes distortion which materially deteriorates the quality of image.

Figure 3A:
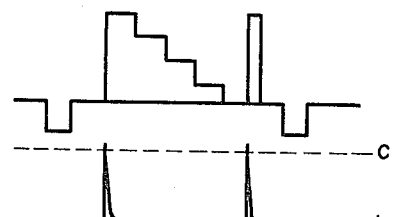
FIGS. 3A to 3E illustrate waveform distortion.
Figure 3B:
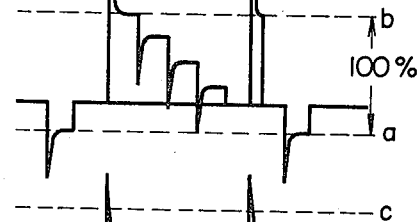
Figure 3C:
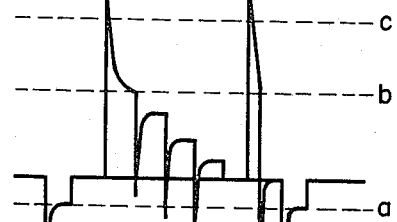
Figure 3D:
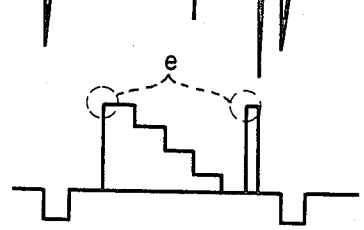
Figure 3E:
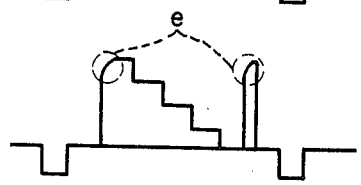

When a luminescence signal as shown in FIG. 3A which is derived by being separated from a color television signal to be recorded is applied to the preemphasis circuit described above, a signal having its high frequency components emphasized as shown in FIG. 3B is produced. In FIG. 3B, levels a and b represent a sink chip and a white peak, respectively, which, when frequency-modulated, are modulated to frequencies of 3.4 MHz and 4.4 MHz, for example, respectively. In the recording and reproducing system, on the other hand, when the signal to be recorded exceeds an upper limit frequency which can be recorded or reproduced, an inversion phenomenon occurs during the playback. Accordingly, it is necessary to white-clip the signal at a level c corresponding to a frequency (e.g. 5 MHz) near the upper limit frequency before the signal is recorded. As a result, as shown in FIG. 3D, the reproduced waveform includes distortion as shown by e at the portions corresponding to those which have been lost by the white-clip. FIG. 3C shows a signal waveform when the amount of preemphasis is increased to improve the S/N ratio. This waveform includes more portions (hatched portions) which have been lost by the white clip and includes more waveform distortion as shown in FIG. 3E resulting in smear which deteriorates the quality of the reproduced image. As a result, the amount of preemphasis in the allowable range is limited to 13 dB to 15 dB and the corner frequency is at approximately 100 to 200 KHz.

The present invention provides a recording and reproducing system which can reduce such waveform distortion and further improve the S/N ratio of the luminescence signal. According to the present invention, a non-linear preemphasis circuit is provided in addition to a conventional preemphasis circuit to change a preemphasis characteristic in accordance with a level of the video signal and during the playback a deemphasis characteristic is changed to reproduce the signal.

FIG. 4A shows a basic configuration of a nonlinear preemphasis circuit which is a feature of the present invention.

Connected between an input terminal 1 to which a luminescence signal is applied and an output terminal 2 are a resistor $R_1$ and a capacitor $C_1$ in parallel, and a resistor $R_2$ is connected between the output terminal 2 and a ground terminal 3. Further connected between the output terminal 2 and the ground terminal 3 are a capacitor $C_2$ and a diode limiter in series, which diode limiter comprises a parallel-opposing connected diodes $D_1$ and $D_2$.

In the arrangement described above, when a large amplitude signal is applied to the input terminal, an amplitude at an input mode 4 to the diodes is also large so that the diodes $D_1$ and $D_2$ conduct resulting in high current flow. As a result, an equivalent resistance of the diodes $D_1$ and $D_2$ is small. When a small amplitude signal is applied to the input terminal, the amplitude at the input node 4 to the diodes is also small and the diodes $D_1$ and $D_2$ are non-conductive. Accordingly, little current flows therethrough and the equivalent resistance thereof is very high. Since the diode can be generally represented by a voltage-current characteristic, FIG. 4A can be represented by an equivalent circuit using an equivalent resistor R, as shown in FIG. 4B.

In FIG. 4B, a transfer function G(S) can be expressed by;

$$G(S) = \frac{E_o}{E_i} \qquad (1)$$

$$= \frac{\left(\frac{1}{R_1} + SC_1\right)(1 + SC_2R)}{\left(\frac{1}{R_1} + \frac{1}{R_2} + SC_1\right)(1 + SC_2R) + SC_2}$$

where $S = j\omega$. In equation (1);

(i) When the input signal is small;

the diodes $D_1$ and $D_2$ are non-conductive and the equivalent resistance R is very large. Accordingly, the transfer function can be expressed as shown below, by dividing the denominator and the numerator of the equation (1) by R and putting $R \to \infty$ to derive a limiting value $\lim_{R \to \infty} G(S)$.

$$\lim_{R \to \infty} G(S) = \qquad (2)$$

$$\lim_{R \to \infty} \frac{\left(\frac{1}{R_1} + SC_1\right)\left(\frac{1}{R} + SC_2\right)}{\left(\frac{1}{R_1} + \frac{1}{R_2} + SC_1\right)\left(\frac{1}{R} + SC_2\right) + \frac{SC_2}{R}}$$

$$= \frac{\frac{1}{R_1} + SC_1}{\frac{1}{R_1} + \frac{1}{R_2} + SC_1}$$

The equation (2) is equal to $R_2/(R_1+R_2)$ in a low frequency band and equal to 1 in a high frequency band. The amount of preemphasis M is given by;

$$M = 20 \log \frac{R_2}{R_1 + R_2} \; (dB)$$

The corner frequencies $f_1$ and $f_2$ are given by;

$$f_1 = \frac{1}{2\pi C_1 R_1}, f_2 = \frac{1}{2\pi C_1 \left(\frac{1}{R_1} + \frac{1}{R_2}\right)}$$

Those are shown in FIG. 5A.

(ii) When the input signal is large;

diodes $D_1$ and $D_2$ conducts and the resistance R approaches to zero. The transfer function at this time is given by a limiting value where R is put to zero in the equation (1);

$$\lim_{R \to 0} G(S) = \frac{\left(\frac{1}{R_1} + SC_1\right)}{\left(\frac{1}{R_1} + \frac{1}{R_2} + SC_1\right) + SC_2} \qquad (3)$$

By multiplying $R_1 R_2$ to the denominator and the numerator of the equation (3), $$\lim_{R \to 0} G(S) = \frac{R_2(1 + SC_1 R_1)}{R_2(1 + SC_1 R_1) + R_1(1 + SC_2 R_2)} \qquad (4)$$

In the equation (4), if $$C_1 R_1 = C_2 R_2 \qquad (5)$$

then, $$\lim_{R \to 0} G(S) = \frac{R_2}{R_1 + R_2} \qquad (6)$$

Accordingly, the amount of preemphasis M is equal to 0 dB, and the preemphasis characteristic is flat relative to the frequency as shown by a line b in FIG. 5.

(iii) When the input signal is moderate;

the equation (1) is applied. That is, the characteristic changes between the curves a and b shown in FIG. 5. An example thereof is shown by a curve c in FIG. 5.

The frequency $f_0$ in FIG. 5 represents a highest frequency (e.g. 4 MHz) in a luminescence signal band. The preemphasis characteristic required for the non-linear preemphasis circuit is between 0 and $f_0$. Thus, the non-linear preemphasis circuit provides different amount of preemphasis and different corner frequency of preemphasis depending on the level of the input signal.

Referring to FIG. 6, how the non-linear preemphasis circuit operates to reduce the waveform distortion and improve the S/N ratio will be explained.

FIG. 6A shows an input signal to the non-linear preemphasis circuit, and FIG. 6B shows a signal applied to the input node 4 to the diodes $D_1$ and $D_2$ in the non-linear preemphasis circuit, that is, a differentiated version of the signal shown in FIG. 6A. A chain line d shows a conduction level for the diode $D_1$ shown in FIG. 4A, and a chain line e shows a conduction level for the diode $D_2$ shown in FIG. 4A. Since a differentiated pulse f has a large amplitude and the diode is conducting, the preemphasis characteristic as shown by the characteristic b in FIG. 5 is provided so that little preemphasis is imparted. A differentiated pulse g has a smaller amplitude than the pulse f. Therefore, the preemphasis is imparted in accordance with the characteristic c shown in FIG. 5. As a result, flat portions h is lowered to a very low level and a strong preemphasis is imparted in accordance with the characteristic a.

FIG. 6C shows a non-linear preemphasis output waveform. At the position of the differentiated pulse f, the output waveform is substantially equal to the input signal waveform. At the position of the differentiated pulse g, the waveform is considerably preemphasized and at the flat portions h the maximum preemphasis is imparted but the waveform is flat. When the signal shown in FIG. 6C is preemphasized by a conventional preemphasis circuit and angular-modulated before it is recorded, and passed through a non-linear deemphasis circuit to be described later during the playback, the S/N ratio of the flat portions of the step wave is greatly improved, the S/N ratio for the period of the pulse g is considerably improved, and the S/N ratio for the period of the pulse f is little improved. As to the waveform distortion, as seen from the signal shown in FIG. 6C, since it is at the position of the pulse f that the maximum white clip is imparted and the output waveform of the non-linear preemphasis circuit at that position is substantially equal to that of the input signal, the waveform distortion as described in conjunction with FIG. 3 does not appear substantially and an overall S/N ratio is considerably improved. FIGS. 6A, 6B and 6C illustrate the preemphasis when normal angular modulation (e.g. frequency modulation for 100% signal). If the input signal level to the non-linear preemphasis circuit is lowered to 50% as shown in FIG. 6A' (note that an output level from a video camera is considerably uniform), the input to the diode is lowered as shown in FIG. 6B' and the output of the non-linear preemphasis circuit is lowered as shown in FIG. 6C'. Comparing FIG. 6C' with FIG. 6C, the amount of preemphasis at the positions f, g and h in FIG. 6C' is larger than that in FIG. 6C. As a result, the range of modulation in the preemphasis circuit is reduced to one half and the S/N ratio of the reproduced signal is considerably lowered. However, when the non-linear preemphasis circuit is used for the signal shown in FIG. 6C', the S/N ratio of the reproduced signal is not lowered appreciably because the amount of preemphasis increases as the input signal level is lowered. The waveform distortion is also small because the amount of emphasis to the 50% signal is smaller than that for the 100% signal.

The output of the non-linear preemphasis circuit which can reduce the waveform distortion and improve the S/N ratio considerably is then applied to the conventional preemphasis circuit (the amount of preemphasis of which is approximately 13 to 15 dB), and an output therefrom is angular-modulated and recorded on a record medium.

In the playback, an inverse conversion to the non-linear preemphasis, that is, a non-linear deemphasis circuit is necessary in addition to a conventional deemphasis circuit corresponding to the conventional preemphasis circuit.

Figure 7A:
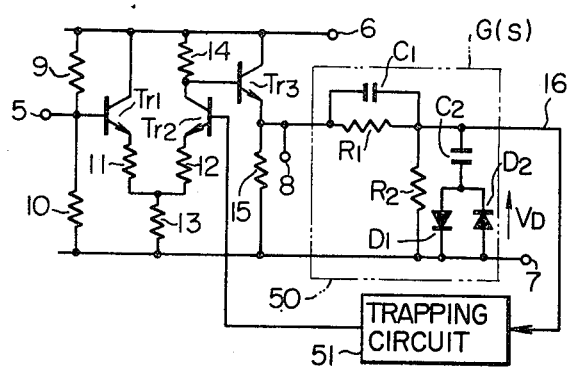
Figure 7B:
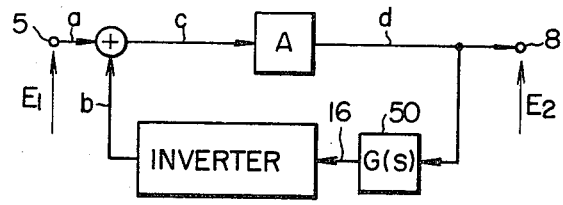

FIG. 7A shows a basic non-linear deemphasis circuit of the present invention, and FIG. 7B shows a basic block diagram thereof.

In FIG. 7A, numeral 5 denotes an input terminal for a reproduced luminescence signal, numeral 6 denotes a power line, numeral 7 denotes ground, numeral 8 denotes an output terminal of the non-linear deemphasis circuit, numerals 9 to 15 denote bias resistors, and $Tr_1$, $Tr_2$ and $Tr_3$ denote transistors which constitute an amplifier. An input signal is applied to the transistor $Tr_1$ and passed through the resistors 11 and 12 to the transistor $Tr_2$ where the signal is amplified, and it is impedance-converted by the transistor $Tr_3$ and passed through the non-linear preemphasis circuit 50 shown in FIG. 4A and a trapping circuit (to be described later) to the base of the transistor $Tr_2$. The configuration of FIG. 7A excluding the trapping circuit 51 is represented by the block diagram shown in FIG. 7B.

In FIG. 7B, a transfer function $G_2(S)$ of the non-linear deemphasis circuit shown in FIG. 7 can be expressed by the following equation, where $E_1$ is an input signal and $E_2$ is an output signal;

$$G_2(S) = \frac{E_2}{E_1} = \frac{A}{1 + AG(S)} \quad (7)$$

where A is a gain of the amplifier. By dividing the denominator and the numerator of the equation (7) by A;

$$G_2(S) = \frac{E_2}{E_1} = \frac{1}{\frac{1}{A} + G(S)} \quad (8)$$

When A is very large;

$$\lim G_2(S) = \frac{E_2}{E_1} = \frac{1}{G(S)} \quad (9)$$

This is the inverse conversion of the non-linear preemphasis shown in FIG. 4. The requirement is that the gain A is very large.

From the equations (1) and (9), in order that the input signal in the recording circuit be equal to the reproduced output signal, $$\frac{E_2}{E_1} = \frac{G(S)}{E_0} \cdot \frac{E_1}{G(S)} = 1$$

must be met. Therefore, $$E_0 = E_1 \quad (10)$$

That is, the level of the output $E_0$ of the non-linear preemphasis circuit must be equal to the level of the output $E_2$ of the non-linear deemphasis circuit.

A voltage $V_{D(REC)}$ applied across the diodes is given from the equivalent circuit of FIG. 4B by;

$$V_{D(REC)} = \frac{SC_2R}{1 + SC_2R} E_0 = \frac{SC_2R}{1 + SC_2R} \cdot G(S) \cdot E_i \quad (11)$$

A signal voltage $V_{D(PB)}$ applied across the diodes of the playback non-linear deemphasis circuit is given as follows. From the equation (9), a signal $E_2$ at the output terminal 8 is given by;

$$E_2 = \frac{E_1}{G(S)} \quad (12)$$

A signal $E_3$ on a signal line 16 is given by;

$$E_3 = E_2 G(S) \quad (13)$$

Accordingly, $$V_{D(PB)} = \frac{SC_2R}{1 + SC_2R} E_3 = \frac{SC_2R}{1 + SC_2R} \cdot E_2 \cdot G(S) \quad (14)$$

By comparing the equation (11) with the equation (14) and putting the equation (10), $$V_{D(REC)} = V_{D(PB)} \quad (15)$$

Thus, since the same signal voltage is applied over the frequency range for both recording circuit and reproducing circuit, the original signal is perfectly reproduced.

As described above, the original luminescence signal is perfectly reproduced but the triangular noise and the modulation noise are suppressed by the playback non-linear deemphasis. Accordingly, the S/N ratio is improved.

Figure 7C:
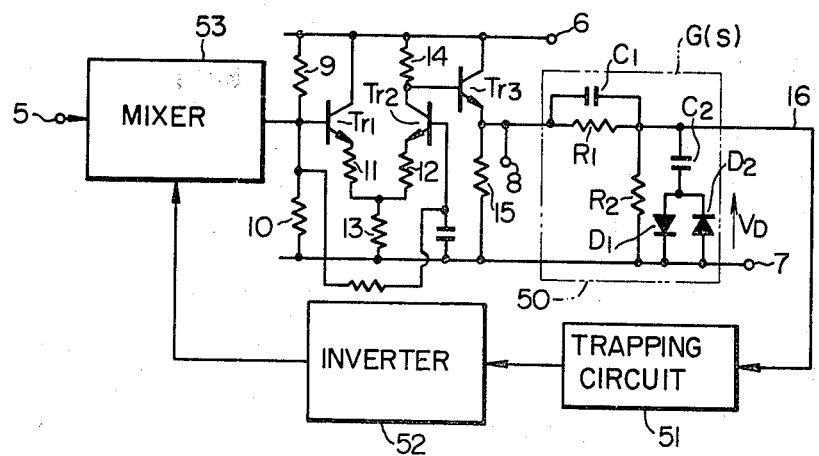

While the output of the trapping circuit 51 is fed back to the base of the transistor $Tr_2$ which constitutes the amplifier in the embodiment of FIG. 7A, the output of the trapping circuit 51 may be fed back in such a manner that it is polarity-inverted by an inverter 52 shown in FIG. 7C and then applied to a mixer 53.

The above description is based on the assumption that the frequency characteristic of the input signal to the non-linear deemphasis circuit is flat (without the non-linear preemphasis characteristic). In a simple construction recording and reproducing system, however, the reproduced signal frequency characteristic shows lower level as the frequency goes up, as shown by a solid line in FIG. 8. When a luminescence which exhibits the frequency characteristic as shown by the solid line in FIG. 8 is applied to the non-linear deemphasis circuit, the amount of deemphasis by the non-linear deemphasis circuit is larger for the higher frequency components resulting in a frequency characteristic as shown by a broken line in FIG. 8. As a result, a resolution power is lowered and sharpness of the image is deteriorated. In order to prevent the above phenomenon, it is necessary to insert a frequency characteristic compensation circuit preceding to the non-linear deemphasis circuit to make the frequency characteristic substantially flat. Furthermore, it is necessary to insert the trapping circuit 51 having a pole near an upper limit of the reproduced signal frequency characteristic between the signal line 16 and the base of the transistor $Tr_2$ shown in FIGS. 7A and 7C. With this arrangement, the amount of deemphasis decreases as the frequency goes up so that the non-linear deemphasis characteristics assume the curves a, b and c shown in FIG. 9 which correspond to the curves a, b and c in FIG. 5. Thus, they differ from the non-linear preemphasis characteristics shown in FIG. 5, in the high frequency region, that is, the amount of deemphasis in the high frequency region is small. As a result, the resolution power is not appreciably lowered. Thus, it is desirable to insert the trapping circuit 51 in the feedback path of the non-linear deemphasis circuit.

Figure 7D:
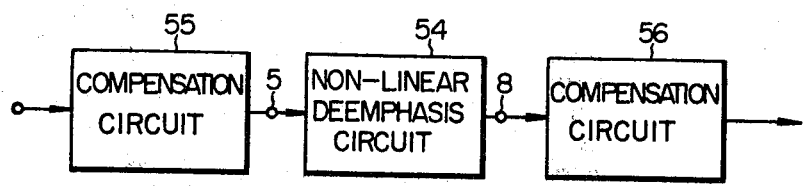

In place of the trapping circuit 51, a configuration shown in FIG. 7D may be used. In FIG. 7D, a compensation circuit 55 having a frequency characteristic for raising the high frequency region up to a flat level or higher in order to compensate for the drop of the level at the high frequency region as shown in FIG. 8 is inserted preceding to the input terminal 5 to the non-linear deemphasis circuit 54 shown in FIG. 7A but without the trapping circuit 51, and a compensation circuit 56 having a reverse characteristic to that of the compensation circuit 55 is connected to the output terminal 8 of the non-linear deemphasis circuit 54.

When the present invention is applied to a VTR to be described later, a new advantage by combination can be attained.

FIG. 10 shows video heads in which one head shown in FIG. 10A has its gap g inclined to the left by angle $\theta$ while the other head shown in FIG. 10B has its gap g inclined to the right by the angle $\theta$. Using those heads having such azimuth angles, signals are alternately recorded on record tracks A and B on a magnetic tape shown in FIG. 11A. (The tracks A and B each corresponds to one field or one frame.) Track pitch is represented by $T_p$ and track width is represented by $T_w$.

Assuming that $T_p=58$ $\mu$m and $T_w=40$ $\mu$m, for example, if the track is misaligned by $T_p-T_w=18$ $\mu$m during playback, a signal from the adjacent track is picked up. The adjacent crosstalk can be expressed by a well-known azimuth loss equation. Since the luminescence signal is angular-modulated (e.g. frequency modulation) at high frequency region, the azimuth loss is large. (When $\theta=6°$, the azimuth loss is approximately $-25$ dB). In addition, when a horizontal sync. signal H is interposed between adjacent tracks as shown in FIG. 11, the frequency $f_2$ (FIG. 12B) of the FM wave from the adjacent track is substantially equal to the frequency $f_1$ (FIG. 12A) of the FM wave from the main signal, that is, $f_1-f_2\approx 0$, because of correlation of fields or frames of the color television signal. As a result, the crosstalk is not substantially visible.

However, long time recording has been demanded recently. In such long time recording, the tape speed $T_s$ at which the record pattern as shown in FIG. 11A is formed is reduced to one half or $T_s/2$ to form a record pattern as shown in FIG. 11B so that the recording time can be extended to be double.

When the signal is recorded in overlapping mode by the head having the track width $T_w$, the track pitch of the record pattern is reduced to $T_p/2$ and the guard band is lost. The reproducing head output is reduced by a factor of $T_p/2\,T_w$ or approximately 3 dB and hence the S/N ratio is lowered. However, the reduction of the S/N ratio can be compensated by the non-linear preemphasis circuit and the non-linear deemphasis circuit. In FIG. 11B, since a track of 29 $\mu$m width is read by the head having the track width of 40 $\mu$m, the width of 11 $\mu$m of the adjacent track is always read. The horizontal sync. signals are not in a line but they are offset by 0.25 H from track to track. Accordingly, even if there exists correlation between the lines or fields of the color television signal, the frequencies of the FM wave differ from each other as shown in FIGS. 12C and 12D and the reproduced luminescence signal has a beat component equal to $f_3-f_4=0-1$ MHz (assuming that the modulation range is 3.4 MHz–4.4 MHz), and a vertical beat, which is a beat with the horizontal sync. signal of the adjacent track, appears at ¼ and 182 positions from the left edge of the screen, and unclear beat appears at other positions. The level thereof is at approximately $-25$ dB because of the azimuth loss described above. When the non-linear preemphasis circuit and the non-linear deemphasis circuit are used, those beat components are small and they can be substantially reduced by applying a large amount of deemphasis. Thus, the present invention is advantageous in substantially reducing the adjacent crosstalk of the luminescence signal in the system in which the signal is reproduced by the head having wider width than the width of the record track and the horizontal sync. signals are not in a line on the record pattern.

The present invention can also be used as a circuit for compensating a difference of the S/N ratio in a system in which normal recording mode and long time recording mode is selectively used (tape speed selection type recording and reproducing system).

In the tape speed selection type recording and reproducing system which can select the normal recording mode and the long term recording mode, the non-linear preemphasis circuit may be constructed as shown in FIG. 13.

In FIG. 13, a difference from the configuration shown in FIG. 4 resides in a switch 15 which is connected in parallel between the input node 4 to the diode limiter and the ground 3. In this arrangement, the switch 15 is turned on in the normal mode (FIG. 11A) by a tape speed selection signal and the input node 4 is shorted to the ground 3. Since $C_1R_1=C_2R_2$ (see equation (5)), the following equation is derived from the equation (6);

$$E_0 = \frac{R_2}{R_1 + R_2} E_i \qquad (16)$$

Thus, the circuit functions as an attenuator to divide the input signal by a ratio of $R_2/(R_1+R_2)$. The frequency characteristic thereof is, of course, flat.

In the long time recording mode (FIG. 11B), the switch 15 is turned off by the tape speed selection signal. Thus, the circuit operates as the non-linear preemphasis circuit described above, to improve the S/N ratio and reduce the adjacent crosstalk. The signal level at this time is given in the following manner. A limiting value of the equation (1) when S approaches to zero is expressed by:

$$\lim_{S \to 0} G(S) = \frac{E_0}{E_i} = \frac{\frac{1}{R_1}}{\frac{1}{R_1} + \frac{1}{R_2}} = \frac{R_2}{R_1 + R_2}$$

Accordingly, $$E_0 = \frac{R_2}{R_1 + R_2} E_i \qquad (17)$$

This is equal to the output represented by the equation (16) for the normal mode. In this manner, the amplitude when the switch 15 is on is equal to the amplitude when the switch 15 is off and hence the modulation range (3.4–4.4 MHz) is constant. Since the circuit configuration is simple and common parts are used both to the attenuator and to the non-linear preemphasis circuit, no level variance due to the variances of parts is included. The switch 15 may be a transistor or a FET, or a microswitch. When an NPN transistor is used, for example, the collector is connected to the terminal 4, the emitter is connected to the terminal 3 and a control voltage may be applied to the base.

In the tape speed selection type recording and reproducing system which enables long time recording, the present invention can improve the S/N ratio in the long time recording mode by simply turning on or off the non-linear preemphasis circuit, without changing the amplitude. Thus, a stable image can be provided.

An overall basic block diagram of the recording and reproducing system in accordance with the present invention is shown in FIG. 14.

In FIG. 14, during record operation, a color television signal is applied to a video signal input terminal 16 and a luminescence signal is extracted by a low-pass filter 17, which signal is not preemphasized when it has a large amplitude and is preemphasized when it has a small amplitude, by a non-linear preemphasis circuit 18. The signal is then preemphasized by a main preemphasis circuit 19 by approximately 13–15 dB. The preemphasized luminescence signal is then clamped by a clamp circuit 20. (It is clamped near the trailing edge of the horizontal sync. signal because the signal has been preemphasized.) The clamped signal is white-clipped by a clipping circuit 21 at a D.C. level corresponding to approximately 5 MHz, for example, in order to prevent the inversion phenomenon during the playback. When the amount of preemphasis is large, dark clipping may also be carried out. The output of the clipping circuit 21 is frequency modulated at a high frequency band by an FM modulator 22. The modulation range may be 3.4 MHz–4.4 MHz, for example.

The frequency modulated wave is passed through a high-pass filter 23 to eliminate frequency components near a low frequency converted sub-carrier (frequency $f_O$), and a carrier chrominance signal which has been converted to a low frequency band is added thereto in a mixer 24. The signal is then passed through a recording amplifier 29 to a video head 30, by which it is recorded on a record medium. On the other hand, the carrier chrominance signal is derived from the input color television signal through a band-pass filter 25, and it is frequency-converted at the carrier of the frequency $f_c+f_s$ by a first frequency converter 26, and converted to a low frequency band by a low-pass filter 28. This low frequency converted carrier chrominance signal (having low frequency converted sub-carrier frequency $f_c$) is applied to the mixer 24.

The carrier has the frequency $f_c+f_s$ and the phase thereof is leading by 90° from line to line in the track A, as shown in FIG. 11 and logging by 90° from line to line in the track B (see arrows shown in FIG. 11), in order to eliminate the crosstalk because the adjacent crosstalk problem would be serious since the frequency of the carrier chrominance signal to be recorded is low (long wavelength) and hence little azimuth loss is included.

In the playback operation, the reproduced signal from the video head 30 is amplified by a preamplifier 31 and a luminescence FM signal is derived from a high-pass filter 32. This signal is passed through a limiter circuit 33 to eliminate amplitude variation and frequency demodulated by an FM demodulator 34. The signal is then passed through a low-pass filter 35 to reproduce the preemphasized luminescence signal, which is then deemphasized by a main deemphasis circuit 36 by approximately 13–15 dB. The signal is further deemphasized in a non-linear deemphasis circuit 37 highly when the signal has a small amplitude and little when the signal has a large amplitude. The resulting signal is further passed through a noise cancelling circuit 38 to suppress the noise. The reproduced carrier chrominance signal is added thereto by a mixer 43 and a video signal output is produced at an output terminal 44. On the other hand, a playback low frequency converted carrier chrominance signal (having a sub-carrier frequency of $f_c \pm \Delta f$, where $\Delta f$ is a jitter) is derived from a portion of the output of the preamplifier 31 by a low-pass filter 39, and it is frequency-converted by a carrier 43 (having a frequency of $f_c+f_s \pm \Delta f$) by a second frequency converter 40, and a difference component is derived from a band-pass filter 41 to produce a carrier chrominance signal having a sub-carrier frequency $f_s$. It is passed through a comb filter 42 to eliminate crosscolor and crosstalk from adjacent tracks. The resulting signal is then applied to the mixer 43 as the reproduced carrier chrominance signal output. The carrier 43 is produced by extracting a burst signal from the reproduced carrier chrominance signal output terminal 44, comparing the phase of the burst signal with a phase of a signal from a fixed frequency oscillator (frequency $f_s$), controlling a first variable frequency oscillator (frequency $f_s$, for example) by an error signal, frequency converting the frequency of the first variable frequency oscillator and a frequency of a second variable frequency oscillator (frequency $f_c$, for example), and combining the both frequency signals. The second variable frequency oscillator is an output of an AFC circuit the phase of which is in synchronism with the reproduced horizontal sync. signal.

The carrier 43 has the frequency of $f_c + f_s + \Delta f$ and the phase thereof is leading by 90° from line to line in the track A as shown in FIG. 11 and lagging by 90° from line to line in the track B, like in the recording operation.

Numeral 45 in FIG. 14 denotes a tape speed selector which selects normal recording mode (pattern shown in FIG. 11A) and long time recording mode (pattern in FIG. 11B). The output of the selector 45 is applied to the non-linear preemphasis circuit 18 and the non-linear deemphasis circuit 37 to turn on and off the switch 15 shown in FIG. 13. (The non-linear deemphasis circuit is completely equivalent).

As described hereinabove, when the non-linear preemphasis circuit and the non-linear deemphasis circuit are operated, the S/N ratio of the luminescence signal in the high density recording can be considerbly improved with little waveform distortion. Furthermore, the crosstalk of the luminescence signal having no aligned horizontal sync. signal on the pattern can be reduced. Further, according to the present invention, the compensation for the difference of S/N ratio due to the selection of the normal recording mode and the long time selection mode is very much facilitated and a stable impage can be provided because the output level is constant.

What is claimed is:

1. A video signal recording and reproducing system in which a video signal to be recorded is passed through preemphasis means and subsequently angular-modulated so that it is recorded on a record medium, and in playback operation the video signal to be reproduced is angular demodulated and then deemphasized through deemphasis means, wherein:

said preemphasis means comprises a first non-linear preemphasis circuit having a frequency characteristic variable according to the amplitude of the video signal applied thereto for emphasizing the amplitude of high frequency components of the video signal to the extent of a first predetermined value, and a fixed preemphasis circuit connected to said non-linear preemphasis circuit for receiving and further emphasizing the amplitude of said high frequency components to the extent of a second predetermined value;

said deemphasis means comprises a fixed deemphasis circuit for deemphasizing noises of the reproduced signal to the extent of the substantially same value as the second predetermined value of said fixed preemphasis circuit, and a non-linear deemphasis circuit connected to said fixed deemphasis circuit for receiving the deemphasized output and further deemphasizing the amplitude of high frequency components of the reproduced signal to the extent of the substantially same value as the first predetermined value of said non-linear preemphasis circuit; said non-linear deemphasis circuit including an amplifier having an input terminal to which a demodulation signal is applied and an output terminal, and a negative feedback circuit for negatively feeding the output of said amplifier back to the input terminal of said amplifier.

2. The system of claim 1, wherein said negative feedback circuit is connected to the input terminal of said amplifier through an additional non-linear preemphasis circuit having substantially the same characteristics as said first non-linear preemphasis circuit.

3. A recording and reproducing system according to claim 1 wherein said negative feedback circuit includes a trapping circuit the amount of feedback of which is minimum near an upper limit frequency of a reproduced signal.

4. A recording and reproducing system according to claim 1 wherein a compensation circuit for raising the relative level of the reproduced signal near the upper limit frequency thereof is connected to the input terminal of said non-linear deemphasis circuit, and a second compensation circuit having a reverse characteristic to that of said compensation circuit is connected to the output terminal of said non-linear deemphasis circuit.

5. A recording and reproducing system according to claim 1 wherein an output level $E_0$ of said non-linear preemphasis circuit in the recording circuit and an output level $E_3$ of said non-linear deemphasis circuit are set such that $E_0 \cong E_3$.

6. A recording and reproducing system according to claim 1 wherein said non-linear preemphasis circuit inserted in said non-linear deemphasis circuit is identical in construction to said non-linear preemphasis circuit inserted in the recording circuit.

7. A recording and reproducing system according to claim 6 wherein a switching means is provided for selectively short-circuiting said parallel circuit of the diodes in each of said non-linear preemphasis circuits.

8. A video signal recording and reproducing system in which a video signal to be recorded is passed through preemphasis means and subsequently angular-modulated so that it is recorded on a record medium, and in playback operation the video signal to be reproduced is angular-demodulated and then deemphasized through deemphasis means, wherein:

said preemphasis means comprises a non-linear preemphasis circuit having a frequency characteristic variable according to the amplitude of the video signal applied thereto for emphasizing the amplitude of high frequency components of the video signal to the extent of a first predetermined value, and a fixed preemphasis circuit connected to said non-linear preemphasis circuit for receiving and further emphasizing the amplitude of said high frequency components to the extent of a second predetermined value; and said deemphasis means comprises a fixed deemphasis circuit for deemphasizing noises of the reproduced signal to the extent of the substantially same value as the second predetermined value of said fixed preemphasis circuit, and a non-linear deemphasis circuit connected to said fixed deemphasis circuit for receiving the deemphasized output and further deemphasizing the amplitude of high frequency components of the reproduced signal to the extent of the substantially same value as the first predetermined value of said non-linear preemphasis circuit, said non-linear deemphasis circuit comprising an amplifier having an input terminal to which a demodulation signal is applied and an output terminal, and a negative feedback circuit for negatively feeding the output of said amplifier back to the input terminal of said amplifier.

9. A recording and reproducing system according to claim 8 wherein said negative feedback circuit includes a non-linear deemphasis having substantially same characteristics as that of the non-linear preemphasis circuit of said preemphasis means, and a trapping circuit connected to said non-linear deemphasis the amount of feedback of which is minimum near an upper limit frequency of the reproduced signal.

* * * * *